United States Patent
Tamaki

[11] Patent Number: 6,061,282
[45] Date of Patent: May 9, 2000

[54] SEMICONDUCTOR MEMORY HAVING AN IMPROVED TEST CIRCUIT

[75] Inventor: Satoshi Tamaki, Tokyo, Japan

[73] Assignee: NEC Corporation, Tokyo, Japan

[21] Appl. No.: 09/126,926

[22] Filed: Jul. 31, 1998

[30] Foreign Application Priority Data

Jul. 31, 1997 [JP] Japan .................................. 9-220973

[51] Int. Cl.[7] .................................................. G11C 29/00
[52] U.S. Cl. ........................... 365/201; 365/194; 365/233
[58] Field of Search .................................. 365/201, 233, 365/189.07, 194, 230.03

[56] References Cited

U.S. PATENT DOCUMENTS 5,757,705  5/1998  Manning ................................. 365/233
5,805,514  9/1998  Iwakiri ................................... 365/201
5,825,712  10/1998  Higashi et al. .................... 365/230.03

Primary Examiner—Tan T. Nguyen
Attorney, Agent, or Firm—Sughrue, Mion Zinn, Macpeak & Seas, PLLC

[57] ABSTRACT

In a semiconductor memory including a memory core and a logic circuit which operate in synchronism with a clock signal, in a normal operation, a data signal outputted from the memory core is latched in a latch circuit provided in the logic circuit in synchronism with a rising edge of the signal which is in the same phase as that of the clock signal. In a test mode, the data signal outputted from the memory core is latched in the latch circuit in synchronism with the rising edge of the signal which is in the phase opposite to that of the clock signal. Therefore, in the test mode, if a high level width or a low level width of the clock signal is changed without changing the frequency of the clock signal, it is possible to measure a delay time on a memory data signal line from the memory core to the logic circuit without elevating the frequency of the clock signal.

4 Claims, 8 Drawing Sheets

SEMICONDUCTOR MEMORY HAVING AN IMPROVED TEST CIRCUIT

BACKGROUND OF THE INVENTION

1. Field of the Invention

The present invention relates to a semiconductor device, and more specifically to a test circuit for a semiconductor memory including an internally incorporated large scaled logic circuit.

2. Description of Related Art

Referring to FIG. 7, there is shown in a block diagram illustrating a general construction of the test circuit for the semiconductor memory including an internally incorporated large-scaled logic circuit. A semiconductor memory is generally designated with Reference Numeral 1 and includes a memory core 2, a large-scaled logic circuit 3, a test mode discriminating circuit 4 and a clock buffer 5, connected as shown. The semiconductor memory 1 also includes an input terminal 11 for a control signal or signals and data signals and an output terminal 12 for data signals, these terminals being connected to the large-scaled logic circuit 3. Furthermore, the semiconductor memory 1 includes an input terminal 41 for a test mode signal, which is connected to the test mode discriminating circuit 4, and an input terminal 51 for a clock signal, which is connected to the clock buffer 5. Reference Numeral 301 designates a bus for memory control signals and data signals outputted from the logic circuit 3 to the memory core 2, and Reference Numeral 302 denotes a bus for data signals outputted from the memory core 2 to the logic circuit 3. Reference Numeral 401 indicates a test signal line from the test mode discriminating circuit 4 to the logic circuit 3, and Reference Numeral 501 shows an internal clock signal line from the clock buffer 5 to the memory core 2 and the logic circuit 3.

Referring to FIG. 8, there is shown a circuit diagram showing a construction of the logic circuit 3 and a connection construction between the logic circuit 3 and the memory core 2 shown in FIG. 7, for illustrating a portion of the test circuit for the memory core. As shown in FIG. 8, the memory core 2 and the logic circuit 3 are operated in synchronism with a rising edge of the clock signal 501.

In order to write to the memory core 2, data to be written is generated in an internal logic circuit 31 of the logic circuit 3 or supplied through the control signal and data signal input terminal 11 from an external of the semiconductor memory 1, and also supplied through a buffer 23 and the memory control signal and data signal bus 301 to the memory core 2.

On the other hand, read-out data is outputted from a buffer 22 of the memory core 2 to the data signal output bus 302, and latched in a data latch 32 in synchronism with for example the rising edge of the internal clock signal 501 so that it is supplied to the internal logic circuit 31.

The data supplied to the internal logic circuit 31 is processed in the internal logic circuit 31 or outputted through the data output terminal 12 to the external of the semiconductor memory.

In the prior art, in order to test the memory core in the semiconductor memory mentioned above, the writing and reading of the memory core 2 are performed by elevating the frequency of the internal clock signal of the internal clock line 501 as shown in FIG. 6, and the data read out from the memory core 2 is compared with an expected value by the internal logic circuit 31, or alternatively, the data read out from the memory core 2 is outputted to an external of the semiconductor memory so that the pass/fail of operation is discriminated by a testing system.

In the above mentioned prior art, however, the following problems have been encountered.

A first problem is that in the operation at the high frequency as shown in the timing chart of FIG. 6 it is difficult to locate or identify a defective portion when the data read out from the memory core 2 is not consistent with the expected value.

Because, the cause for the defective operation in the high frequency operation can be classified to three, namely, (1) the inside of the memory core 2;

(2) the internal logic circuit 31; and (3) a signal delay between the memory core 2 and the logic circuit 3.

However, it is impossible to determine one among the three probable causes, by only the frequency dependency.

A second problem is that in order to separate the third cause (3) in connection with the first problem as mentioned above, it is necessary to previously prepare the buffer 22 having a large driving capability so that the signal delay is made sufficiently small.

However, since the memory core 2 consumes a large current as one macro cell, it is actually impossible to prepare the buffer 22 having a large driving capability similar to that of the buffer 23 of the internal logic circuit 31, from the viewpoint of a power consumption.

SUMMARY OF THE INVENTION

Accordingly, it is an object of the present invention to provide a semiconductor memory which has overcome the above mentioned problems of the prior art.

Another object of the present invention is to provide a semiconductor memory configured to minimize the power consumption of the memory core and capable of precisely measure the delay time from the memory core to the logic circuit (access time of memory core).

The above and other objects of the present invention are achieved in accordance with the present invention by a semiconductor memory including a memory core and a logic circuit which operate in synchronism with a clock signal, wherein the logic circuit includes a clock signal control circuit receiving the clock signal and a test mode signal for outputting a logic circuit clock signal which is in the same phase as that of the clock signal when the test mode signal is inactive and which is in the phase opposite to that of the clock signal when the test mode signal is active, and a latch circuit for latching a data signal outputted from the memory core, in synchronism with a rising edge of the logic circuit clock signal, and an internal logic circuit receiving the data signal latched in the latch circuit for comparing the received data signal with an expected value so as to perform a pass/fail discrimination or to output the received data signal to an external of the semiconductor memory.

With the above mentioned arrangement, in the semiconductor memory including a memory core and a logic circuit which operate in synchronism with a clock signal, in a situation other than the test node, the data signal outputted from the memory core is latched in the latch circuit in synchronism with the rising edge of the signal which is in the same phase as that of the clock signal, and in the test mode, the data signal outputted from the memory core is latched in the latch circuit in synchronism with the rising edge of the signal which is in the phase opposite to that of the clock signal. Therefore, in the test mode, if a high level width or a low level width of the clock signal is changed by for example a test system, it is possible to measure the access time of the memory core (delay time on a memory data signal line from the memory core to the logic circuit) without elevating the frequency of the clock signal.

The above and other objects, features and advantages of the present invention will be apparent from the following description of preferred embodiments of the invention with reference to the accompanying drawings.

DESCRIPTION OF THE PREFERRED EMBODIMENTS

Figure 1:
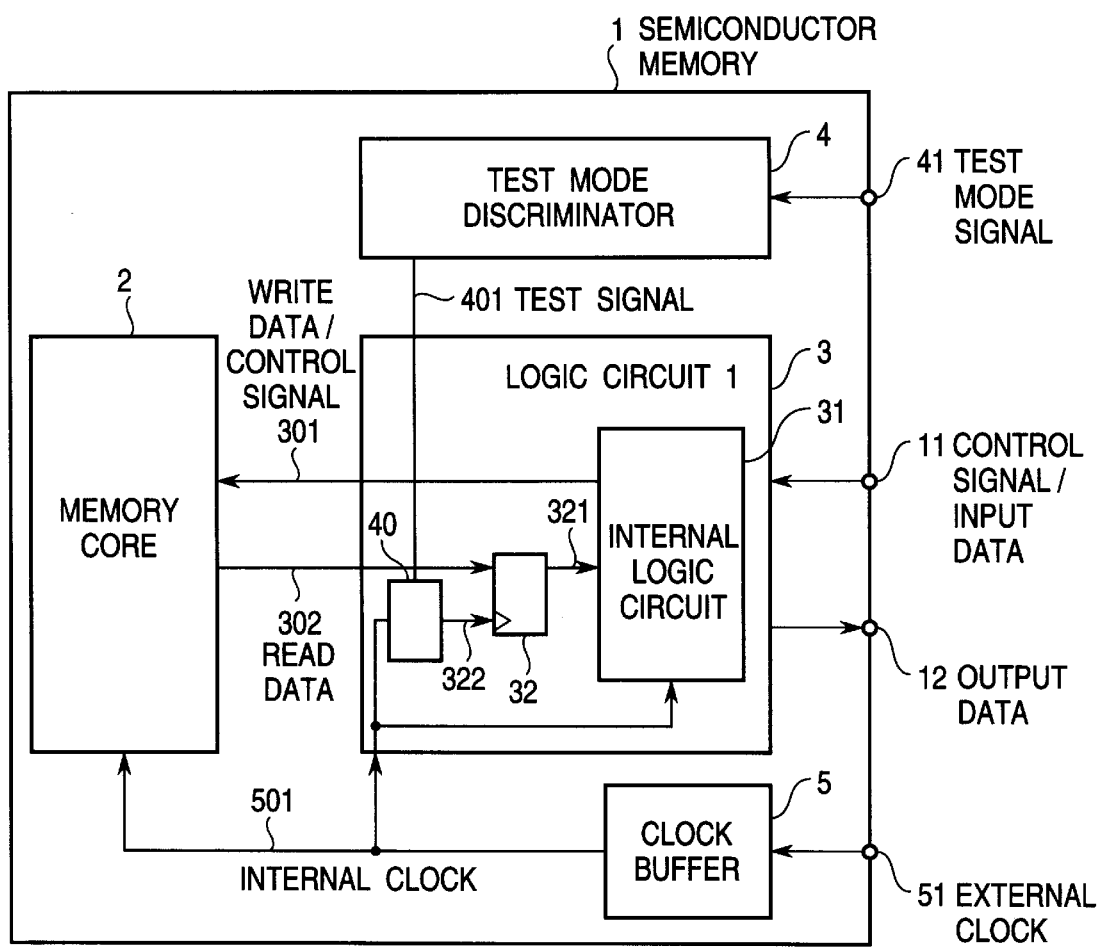
FIG. 1 is a block diagram illustrating the construction of a first embodiment of the semiconductor memory in accordance with the present invention.
Figure 7:
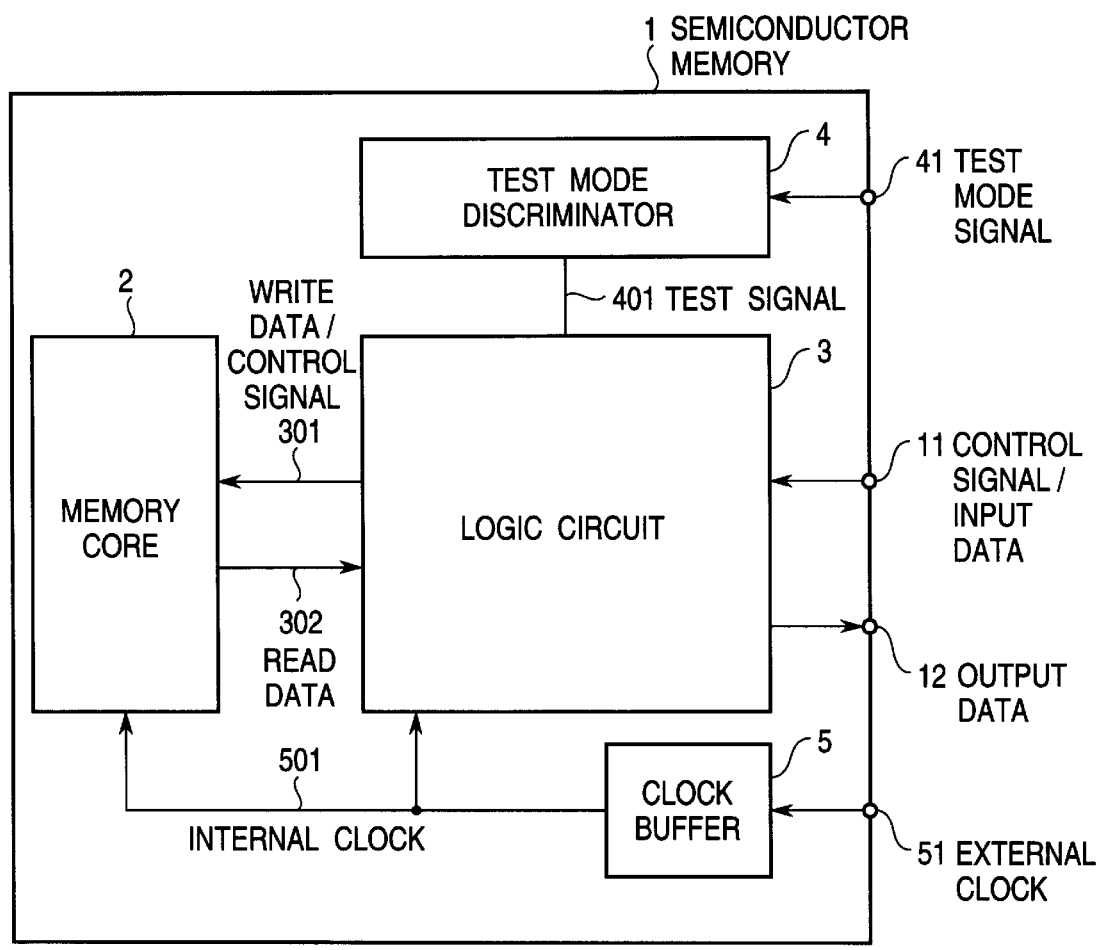
FIG. 7 is a block diagram illustrating a general construction of the prior art semiconductor memory.
Figure 8:
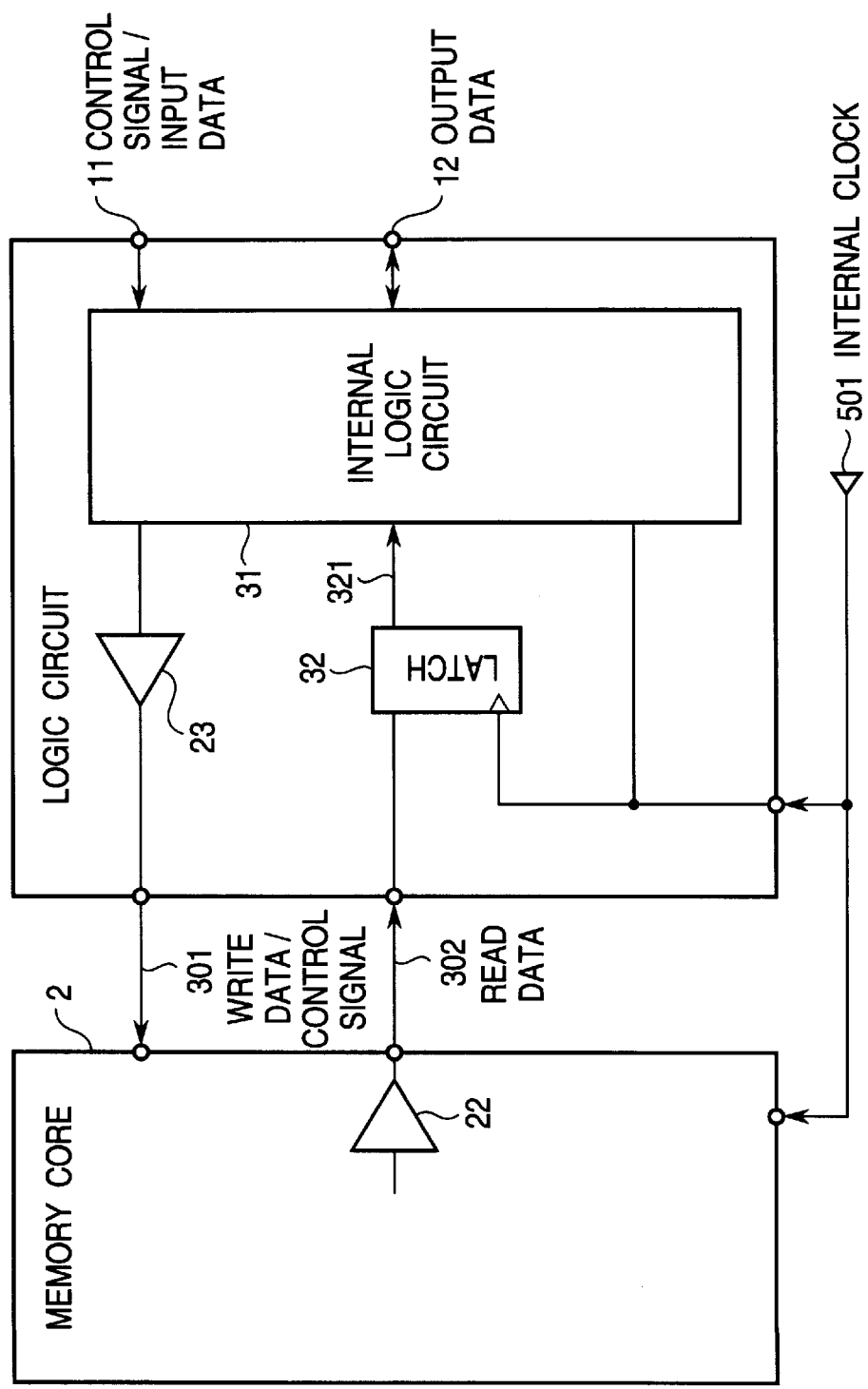
FIG. 8 is a circuit diagram showing a construction of the logic circuit and a connection construction between the logic circuit and the memory core in the prior art semiconductor memory shown in FIG. 7.

Referring to FIG. 1, there is shown a block diagram illustrating the construction of a first embodiment of the semiconductor memory in accordance with the present invention. In FIG. 1, elements similar to those shown in FIG. 7 are given the same Reference Numerals.

The shown semiconductor memory 1 includes a memory core 2 and a large-scaled logic circuit 3, which operate in synchronism with a clock signal. The semiconductor memory 1 also includes a test mode discriminating circuit 4, a clock buffer 5, and one or a plurality of input terminals 11 for control signals and data signals and one or a plurality of output terminals 12 for data signals and control signals. The input terminals 11 and the output terminals 12 are connected to input terminals and output terminals of the large-scaled logic circuit 3, respectively. Furthermore, the semiconductor memory 1 includes one or a plurality of test signal input terminals 41 and a clock signal input terminal 51, which are connected to the test mode discriminating circuit 4 and the clock buffer 5, respectively.

The clock buffer 5 receiving the clock signal through the clock input terminal 51, outputs an internal clock onto an internal clock signal line 501, which is connected to a clock input terminal of each of the memory core 2 and the logic circuit 3, so that each of the memory core 2 and the logic circuit 3 operates in synchronism with the internal clock signal 501. The test mode discriminating circuit 4 receives a test mode signal through the test signal input terminal 41 and outputs a test signal onto a test signal line 401, which is connected to the logic circuit 3.

The memory core 2 has input terminals connected to a bus 301 for memory control signals and data signals and output terminals connected to a bus 302 for data signals. The bus 301 and the bus 302 are connected to the logic circuit 3. Thus, the reading and the writing of the memory core 2 is controlled by the logic circuit 3 and executed in synchronism with a rising edge of the internal clock on the internal clock signal line 501.

Similarly, the logic circuit 3 operates in synchronism with the rising edge of the internal clock on the internal clock signal line 501. The logic circuit 3 receives the control signals and the data signals from an external of the semiconductor memory 1 through the one or the plurality of control signal and data signal input terminals 11, and outputs the data signals and the control signals to the external of the semiconductor memory 1 through the one or the plurality of data signal output terminals 12. The logic circuit 3 also includes internal output terminals connected to the memory control signal and data signal bus 301 for supplying the memory control signals and the data signals to the memory core 2 so as to control the memory core 2. Furthermore, the logic circuit 3 includes internal input terminals connected to the memory output data signal bus 302 for receiving the data signal read out from the memory core 2.

In addition, the logic circuit 3 includes a clock control circuit 40 receiving the internal clock signal 501 and controlled by the test signal 401 so as to output from a clock output 322 an inverted clock signal when the test signal 401 is active, and a data latch group 32 having one or a plurality of input terminals connected to the memory output data signal bus 302, a clock input connected to the clock output 322 of the clock control circuit 40 and an output 321.

Furthermore, the logic circuit 3 includes an internal logic circuit 31 having a clock input connected to the internal clock signal line 501, and operates in synchronism with the rising edge of the internal clock 501 and on the basis of the signals supplied to the control signal and data signal input terminals 11, for controlling the semiconductor memory 1 through the memory control signal and data signal bus 301 and the memory output data signal bus 302 and outputting the data through the data signal output terminals 12.

An operation of the shown embodiment will be described briefly.

When the test mode is not designated through the test mode input terminal 41, namely, in a situation other than the test mode, the clock control circuit 40 outputs the clock signal 322 having the same phase as that of the internal clock signal 501, so that the latch group 32 latches the read-out data 302 in synchronism with the rising edge of the internal clock 501. Accordingly, the memory core 2 and the whole of the logic circuit 3 in the semiconductor memory 1 operate in synchronism with the rising edge of the internal clock 501.

On the other hand, when the test mode is designated through the test mode input terminal 41, the clock control circuit 40 outputs the clock signal 322 having the phase opposite to that of the internal clock signal 501, to the clock input of the latch group 32. As a result, only the latching of the read-out data 302 from the memory core 2 is performed in synchronism with the rising edge of an inverted signal of the internal clock 501, namely, in synchronism with a falling edge of the internal clock 501.

Figure 5:
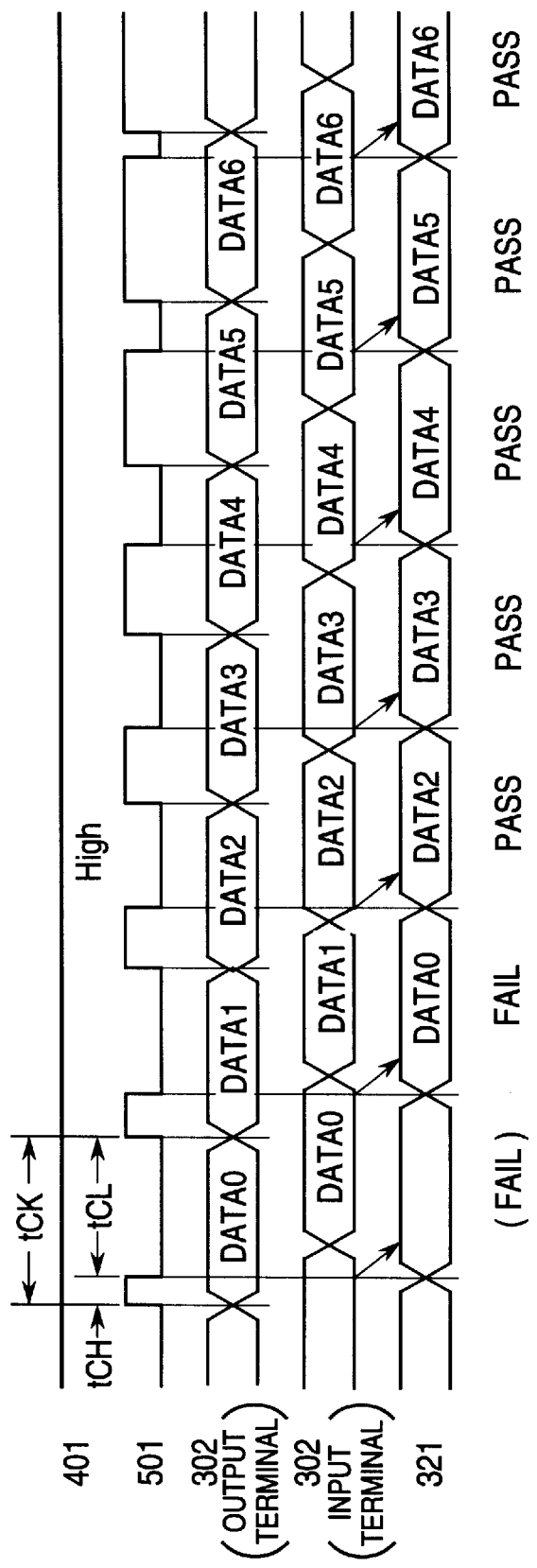
FIG. 5 is a timing chart illustrating an operation in the test mode, of the semiconductor memory in accordance with the present invention.
Figure 6:
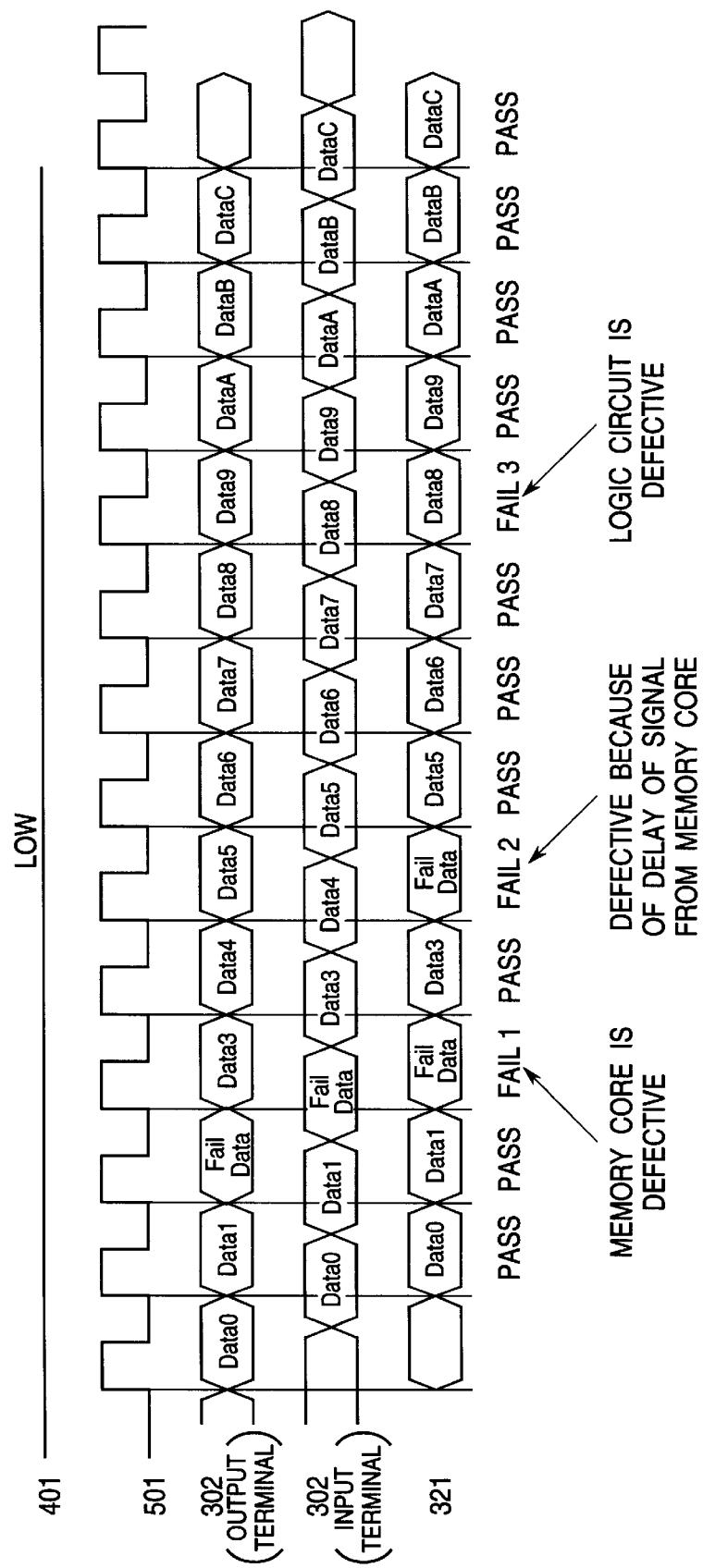
FIG. 6 is a timing chart illustrating an operation in the test mode, of the prior art semiconductor memory.

Thus, by adjusting the high level width and the low level width of the clock signal without changing the frequency of the clock signal as shown in the timing chart of FIG. 5, it is possible to measure the delay time on the memory data signal line 302 from the memory core 2 to the logic circuit 3.

Figure 2:
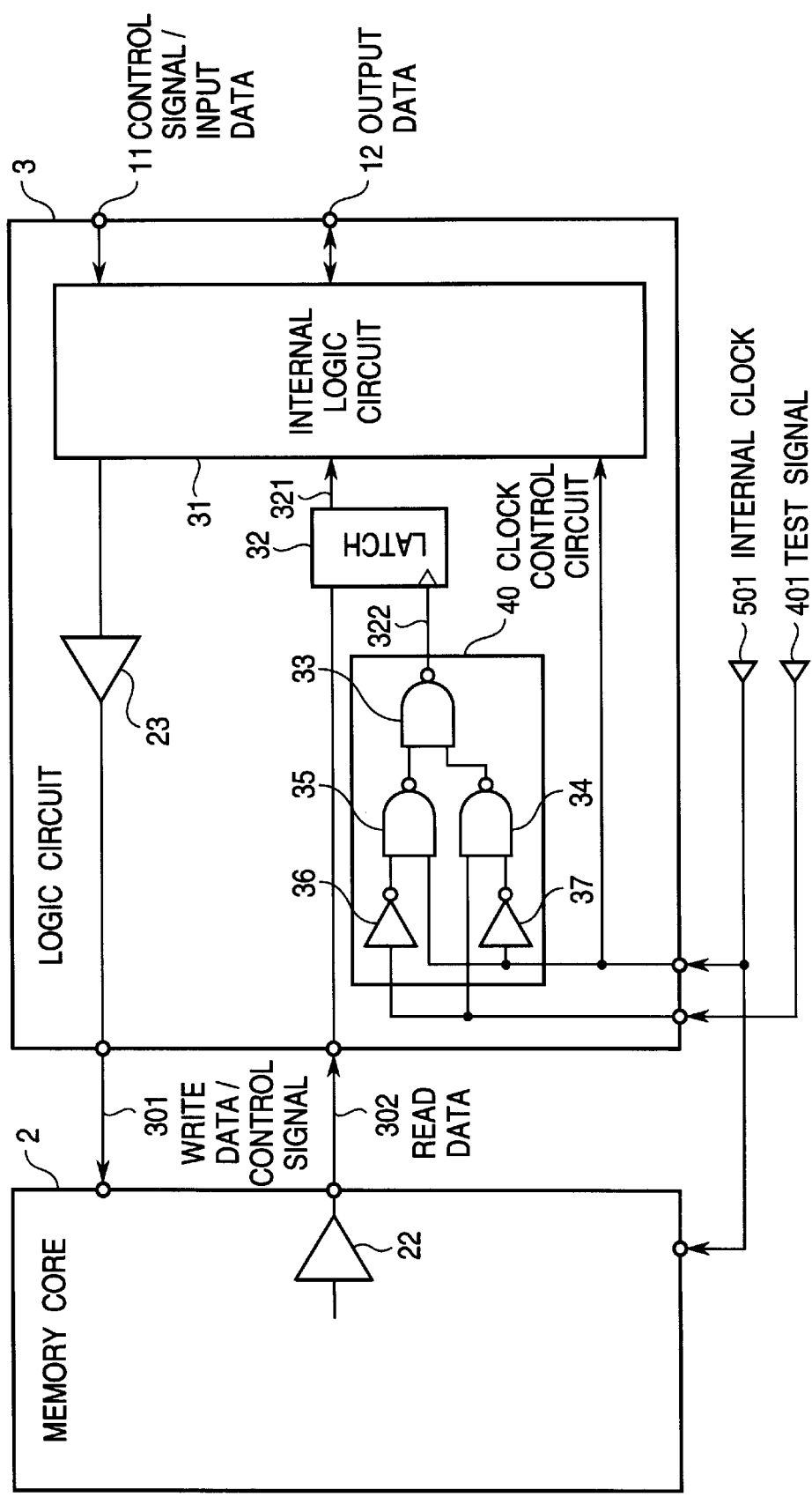
FIG. 2 is a circuit diagram illustrating a construction of the logic circuit and a connection construction between the logic circuit and the memory core in the semiconductor memory shown in FIG. 1.

Referring to FIG. 2, there is shown a circuit diagram illustrating a construction of the logic circuit and a connection construction between the logic circuit and the memory core in the semiconductor memory shown in FIG. 1. In FIG. 2, elements corresponding to those shown in FIG. 1 are given the same Reference Numerals, and explanation thereof will be omitted.

The memory control signals and the write data signals outputted from the internal logic circuit 31 are supplied through a buffer group 23 to the memory control signal and data signal bus 301 and then to the memory core 2. The data signals read out in the memory core 22 are outputted from a buffer group 22 to the memory output data signal bus 302 and then to the latch group 32 of the logic circuit 3.

The clock signal control circuit 40 includes an inverter 36 having an input connected to receive the test signal 401, another inverter 37 having an input connected to receive the internal clock 501, a first two-input NAND gate 35 having a first input connected to an output of the inverter 36 and a second input connected to receive the internal clock 501, a second two-input NAND gate 34 having a first input connected to receive the test signal 401 and a second input connected to an output of the inverter 37, and a third two-input NAND gate 33 having two inputs connected to an output of the first and second NAND gates 35 and 34, respectively, and an output for outputting the clock signal 322.

With this arrangement, when the test signal 401 is inactive, namely, at a logical low level indicating that the operation is not in the test mode, the signal having the same phase as that of the internal clock 501 is outputted as the clock signal 322. On the other hand, when the test signal 401 is active, namely, at a logical high level indicating that the operation is in the test mode, the inverted signal of the internal clock 501 is outputted as the clock signal 322.

Now, an operation will be described.

Figure 4:
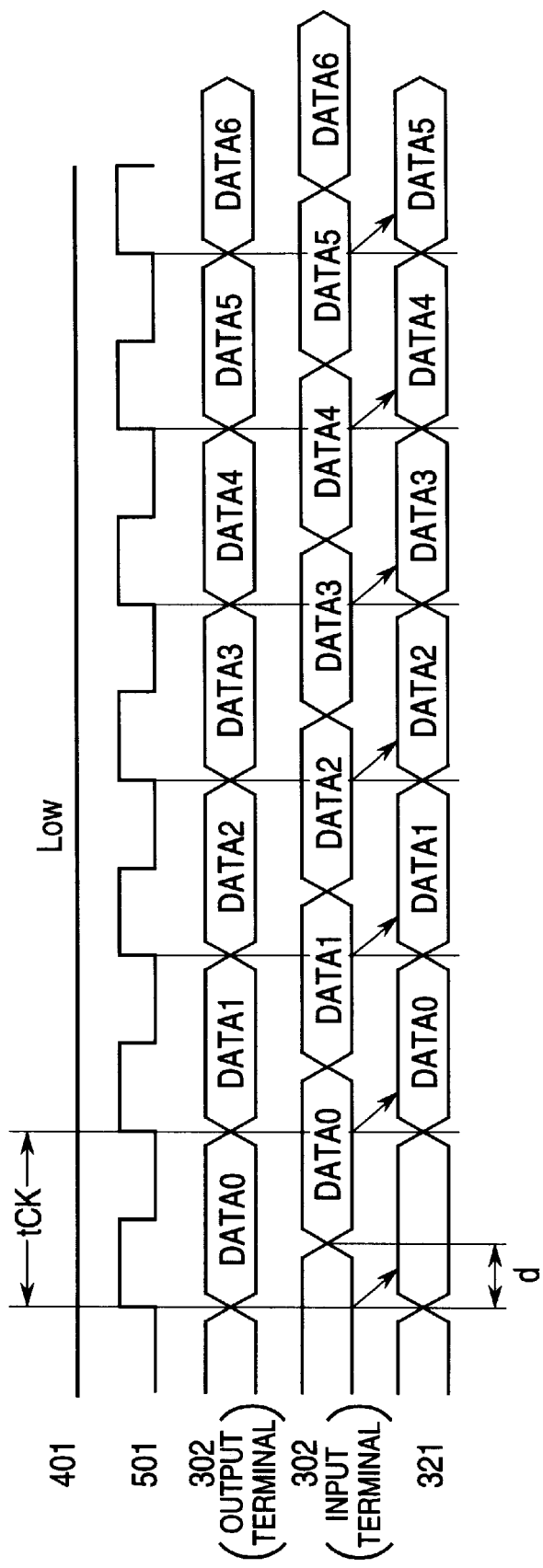
FIG. 4 is a timing chart illustrating an operation in a normal mode (other than the test mode), of the semiconductor memory in accordance with the present invention and the prior art semiconductor memory.

In the situation other than the test mode, the test signal 401 is maintained at the logical low level, as shown in FIG. 4, and therefore, the clock control circuit 40 outputs the clock signal 322 having the same phase as that of the internal clock 501. Therefore, all the circuits in the semiconductor memory 1 operate in synchronism with the rising edge of the internal clock 501. In this situation, assuming that the delay time "d" exists from an output terminal of the memory core 2 to an input terminal of the logic circuit 3 also shown in FIG. 4, since both of the memory core 2 and the logic circuits 3 operate in synchronism with the rising edge of the internal clock 501, the read-out data outputted from the memory core 2 in synchronism with the rising edge of one internal clock 501, is latched in the latch group 32 in synchronism with the rising edge of the internal clock 501 next to the one internal clock 501, so that the output 321 of the latch group 32 is supplied to the internal logic circuit 31.

On the other hand, when the test signal 401 is at the logical high level to designate the test mode, as shown in FIG. 5, the clock control circuit 40 outputs the clock signal 322 having the phase opposite to that of the internal clock 501. In other words, the read-out data on the memory output data signal bus 302 is latched in the latch group 32 in synchronism with the falling edge of the internal clock 501, as shown in FIG. 5.

Therefore, while changing a high level width (tCH) and a low level width (tCL) of the internal clock 501 (and hence the external clock 51) without changing the period (tCK) of the internal clock 501, the read-out data latched in the latch group 32 is compared with an expected value of the read-out data by the internal logic circuit 31 or a test system (not shown) external to the semiconductor memory. When the read-out data latched in the latch group 32 is compared with the expected value of the read-out data by the internal logic circuit 31, the result of the comparison is outputted from the internal logic circuit 31 through the output data terminal 12. When the read-out data latched in the latch group 32 is compared with the expected value of the read-out data by the test system (not shown) external to the semiconductor memory, the read-out data latched in the latch group 32 is supplied by the internal logic circuit through the output data terminal 12 to the test system (not shown) external to the semiconductor memory.

In the shown example, when the high level width (tCH) of the internal clock 501 is gradually increased as seen from FIG. 5, the data just before "DATA0" is not latched in the latch group 32 in response to the first internal clock 501 shown in FIG. 5, and "DATA0" is not also latched in the latch group 32 in response to the second internal clock 501 shown in FIG. 5. Further, "DATA1" is not latched in the latch group 32 in response to the third internal clock 501 shown in FIG. 5, but "DATA2" is latched in the latch group 32 in response to the third internal clock 501 shown in FIG. 5. Accordingly, it would be known that the delay time "d" on the memory output data signal bus 302 from the output terminal of the memory core 2 to the input terminal of the logic circuit 3 is larger than the high level width (tCH) of the second internal clock 501 but small than the high level width (tCH) of the third internal clock 501.

Accordingly, the delay time "d" on the memory output data signal bus 302 from the output terminal of the memory core 2 to the input terminal of the logic circuit 3 can be easily measured by gradually changing the high level width (tCH) and the low level width (tCL) of the external clock supplied to the clock terminal 51 from the test system (not shown) without changing the period (tCK) (namely, the frequency) of the external clock 51.

As seen from the above, in the shown embodiment, when the driving capability of the buffer 22 is small and when the signal delay time "d" on the memory output data signal bus 302 is optimized for a cycle time T of the clock signal 501 in the normal operation excluding the test mode, the signal delay time "d" can be measured without elevating the operating frequency of the internal logic circuit 31 and the memory core 2.

Figure 3:
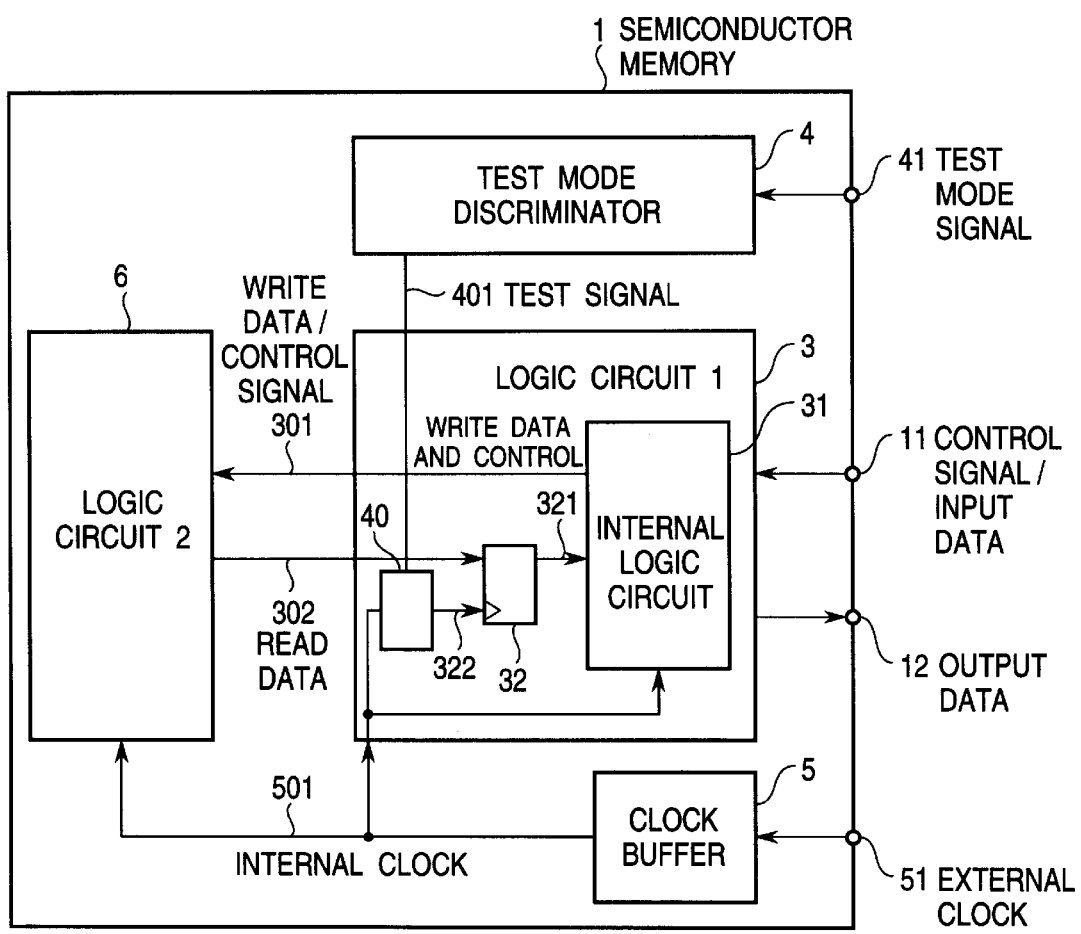
FIG. 3 is a block diagram illustrating the construction of a second embodiment of the semiconductor memory in accordance with the present invention.

In the above mentioned embodiment, the signal delay time "d" on the memory output data signal bus 302 from an output terminal of the memory core 2 to an input terminal of the logic circuit 3 is measured. However, if the memory core 2 is replaced with another logic circuit 6 as shown in FIG. 3, it is possible to measure the signal delay time "d" on the output data signal bus 302 from an output terminal of the logic circuit 6 to the input terminal of the logic circuit 3. In FIG. 3, elements corresponding to those shown in FIG. 1 are given the same Reference Numerals, and explanation thereof will be omitted for simplification of the description.

As seen from the above, according to the present invention, it is possible to measure the delay time of the data signal read out from the memory, without elevating the operation frequency.

In the prior art, the signal delay time "d" from the output terminal of the memory core to the input terminal of the logic circuit could be measured with only the clock period (tCK). In the present invention, however, since the data signal read out from the memory is captured into the logic circuit in response to the clock signal in the normal operation but in response to the inverted signal of the clock signal in the test mode, it is possible to measure the signal delay time "d" from the memory core to the logic circuit in the test mode, by changing the high level width (tCH) and the low level width (tCL) of the clock signal.

Furthermore, according to the present invention, the increase of the power consumption can be avoided since it is not necessary to elevate the operation frequency.

In addition, it is no longer necessary to use a buffer having a large driving capability as the output buffer of the memory core.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory including a memory core and a logic circuit which operate in synchronism with a clock signal, wherein the logic circuit includes a clock signal control circuit receiving said clock signal and a test mode signal for outputting a logic circuit clock signal which is in the same phase as that of said clock signal when said test mode signal is inactive and which is in the phase opposite to that of said clock signal when said test mode signal is active, and a latch circuit for latching a data signal outputted from said memory core, in synchronism with a rising edge of said logic circuit clock signal, and an internal logic circuit receiving said data signal latched in said latch circuit for comparing the received data signal with an expected value so as to perform a pass/fail discrimination or to output said received data signal to an external of the semiconductor memory.

2. A semiconductor memory claimed in claim 1 wherein the access time to said memory core can be measured in a test mode by changing a high level width or a low level width of said clock signal without elevating the frequency of said clock signal.

3. A semiconductor memory including a memory core and a logic circuit which operate in synchronism with a predetermined direction transition edge of a clock signal, comprising a latch circuit for latching a data signal outputted from said memory core, and means for causing said latch circuit to latch said data signal outputted from said memory core at a signal having the same phase as that of said clock signal in a condition other than a test mode, and at a signal having the phase opposite to that of said clock signal in said test mode, so that in said test mode, the access time to said memory core can be measured by changing a high level width or a low level width of said clock signal without elevating the frequency of said clock signal.

4. A semiconductor device including a plurality of logic circuits which operate in synchronism with a predetermined direction transition edge of a clock signal, comprising a latch circuit provided in a first logic circuit, for latching a data signal outputted from a second logic circuit, and means for causing said latch circuit to latch said data signal outputted from said second logic circuit at a signal having the same phase as that of said clock signal in a condition other than a test mode, and at a signal having the phase opposite to that of said clock signal in said test mode, so that in said test mode, the delay time from said second logic circuit to said first logic circuit can be measured by changing a high level width or a low level width of said clock signal without elevating the frequency of said clock signal.

* * * * *

UNITED STATES PATENT AND TRADEMARK OFFICE
CERTIFICATE OF CORRECTION

PATENT NO.    : 6,061,282
DATED         : May 9, 2000
INVENTOR(S)   : Satoshi Tamaki Page 1 of 1

It is certified that error appears in the above-identified patent and that said Letters Patent is hereby corrected as shown below:

Title page,
Category "References Cited", add the following:

Item [56] 5,606,567    2/25/97    Agrawal, et al.
Item [56] 5,473,618    12/5/95    Takeshita, et al.
EP 0 867 887 A2        9/3/98     European Patent Publication Signed and Sealed this Second Day of October, 2001

Attest:

NICHOLAS P. GODICI
Attesting Officer    Acting Director of the United States Patent and Trademark Office